United States Patent
Gilleo et al.

(12)

(10) Patent No.: US 6,228,681 B1
(45) Date of Patent: May 8, 2001

(54) FLIP CHIP HAVING INTEGRAL MASK AND UNDERFILL PROVIDING TWO-STAGE BUMP FORMATION

(75) Inventors: Kenneth Burton Gilleo, Cranston, RI (US); David Blumel, New York, NY (US)

(73) Assignee: Fry's Metals, Inc., Jersey City, NJ (US)

( * ) Notice: Subject to any disclaimer, the term of this patent is extended or adjusted under 35 U.S.C. 154(b) by 0 days.

(21) Appl. No.: 09/395,558

(22) Filed: Sep. 14, 1999

Related U.S. Application Data

(63) Continuation-in-part of application No. 09/266,166, filed on Mar. 10, 1999.

(51) Int. Cl.[7] .......................... H01L 21/44; H01L 21/48; H01L 21/50
(52) U.S. Cl. .......................... 438/108; 438/612; 438/613; 438/614; 228/180.21; 228/180.22
(58) Field of Search ........................... 438/108, 612–614; 228/180.21, 180.22

(56) References Cited

U.S. PATENT DOCUMENTS

| 5,128,746 | | 7/1992 | Pennisi . | |
| 5,493,075 | * | 2/1996 | Chong et al. | 174/261 |
| 6,046,071 | * | 4/2000 | Sawai et al. | 438/106 |

FOREIGN PATENT DOCUMENTS

WO99/04430   1/1999   (WO) .

* cited by examiner

Primary Examiner—John F. Niebling
Assistant Examiner—David A Zarneke
(74) Attorney, Agent, or Firm—Mintz, Levin, Cohn, Ferris, Glovsky and Popeo, P.C.

(57) ABSTRACT

The present invention relates to a process for forming a two-stage bump on a flip chip. The process employs an underfill material which can be formed to act as a mask for application of bumps formed from a first composition to the flip chip. A material having a different composition can then be applied to the bumps.

23 Claims, 1 Drawing Sheet

FLIP CHIP HAVING INTEGRAL MASK AND UNDERFILL PROVIDING TWO-STAGE BUMP FORMATION

RELATED APPLICATIONS

This application is a continuation in part of U.S. patent application, Ser. No. 09/266,166, filed Mar. 10, 1999 and entitled "Flip Chip With Integrated Mask and Underfill"

FIELD OF THE INVENTION

The present invention relates to a novel flip chip design. More particularly, the present invention relates to a flip chip which incorporates two-stage bumps, flux and an underfill material, wherein the underfill material acts as a mask during application of the bumps in a manner that supports the fabrication of two-stage bumps.

BACKGROUND OF THE INVENTION

In the electronics industry, electrical components such as resisters, capacitors, inductors, transistors, integrated circuits, chip carriers and the like are typically mounted on circuit boards in one of two ways. In the first way, the components are mounted on one side of the board and leads from the components extend through holes in the board and are soldered on the opposite side of the board. In the second way, the components are soldered to the same side of the board upon which they are mounted. These latter devices are said to be "surface-mounted."

Surface mounting of electronic components is a desirable technique in that it may be used to fabricate very small circuit structures and in that it lends itself well to process automation. One family of surface-mounted devices, referred to as "flip chips", comprises integrated circuit devices having numerous connecting leads attached to pads mounted on the underside of the device. In connection with the use of flip chips, either the circuit board or the chip is provided with small bumps or balls of solder (hereafter "bumps" or "solder bumps") positioned in locations which correspond to the pads on the underside of each chip and on the surface of the circuit board. The chip is mounted by (a) placing it in contact with the board such that the solder bumps become sandwiched between the pads on the board and the corresponding pads on the chip; (b) heating the assembly to a point at which the solder is caused to reflow (i.e., melt); and (c) cooling the assembly. Upon cooling, the solder hardens, thereby mounting the flip chip to the board's surface. Tolerances in devices using flip chip technology are critical, as the spacing between individual devices as well as the spacing between the chip and the board is typically very small. For example, spacing of such chips from the surface of the board is typically in the range of 0.5–3.0 mil and is expected to approach micron spacing in the near future.

Although many materials can be used to form the bumps used on a flip chip, metallurgical solder is the most common. Several methods of applying solder to the pads on a flip chip are known to those having ordinary skill in the art. These methods include: vacuum metallization, electrolytic deposition, electroless deposition, and stencil printing of solder paste. In many of these processes, a mask formed of a polymeric material, (also called a resist), is applied to the wafer and openings are created in the mask at the chip pad locations. Bumps formed in the mask openings are referred to herein as columns. The mask is later removed.

Although many types of bumps have been developed over the past years, a stratified bump composition containing more than one material zone has shown promise. This is because a bump having at least two different material zones can have each zone tailored to the specific substrate or application involved at the specific material zone. For example, the section of bump attached to the pad on the integrated circuit is typically made of a high temperature alloy so that melting will not occur during assembly. This ensures that the bump will not over-collapse and produce low height and too narrow a gap between the chip and the circuit board to which the chip is attached. In contrast, however, it is desirable to have the surface of the bump that contacts the circuit board to be of a relatively low melting point material so that reflow and adherence to the circuit board can be achieved without the need for excessive heat. Thus, it should be apparent that an ideal bump would have a high melting point portion mounted to the integrated circuit chip, and a low melting point portion in contact with the circuit board.

The present method for making such bumps involves vacuum-depositing a high lead alloy such as 3Sn/97Pb followed by coating with eutectic solder. Such bumps are referred to as "two-stage" bumps. After reflow soldering, the chip is then underfilled for the reasons described below.

One problem associated with flip chip technology is that the chips, the bumps and the material forming the circuit board often have significantly different coefficients of thermal expansion. As a result, differing expansions as the assembly heats during use can cause severe stresses, i.e., thermomechanical fatigue, at the chip connections and can lead to failures which degrade device performance or incapacitate the device entirely.

In order to minimize thermomechanical fatigue resulting from different thermal expansions, thermoset epoxies have been used. Specifically, these epoxies are used as an underfill material which surrounds the periphery of the flip chip and occupies the space beneath the chip between the underside of the chip and the board which is not occupied by solder. Such epoxy systems provide a level of protection by forming a physical barrier which resists or reduces different expansions among the components of the device.

Improved underfill materials have been developed in which the epoxy thermoset matenal is provided with a silica powder filler. By varying the amount of filler material, it is possible to cause the coefficient of thermal expansion of the filled epoxy thermoset to match that of the solder. In so doing, relative movement between the underside of the flip chip and the solder connections, resulting from their differing coefficients of thermal expansion, is minimized. Such filled epoxy thermosets therefore reduce the likelihood of device failure resulting from thermomechanical fatigue during operation of the device.

While underfill has solved the thermal mismatch problem for flip chips on printed circuit boards, it has created significant difficulties in the manufacturing process. For example, the underfill must be applied off-line using special equipment. Typically, the underfill is applied to up to three edges of the assembled flip chip and allowed to flow all the way under the chip. Once the material has flowed to opposite edges and all air has been displaced from under the chip, additional underfill is dispensed to the outer edges so as to form a fillet making all four edges symmetrical. This improves reliability and appearance. Next, the assembly is baked in an oven to harden the underfill. This process, which may take up to several hours, is necessary to harden and fully cure the underfill. Thus, although the underfill solves the thermal mismatch problem and provides a commercially viable solution, a simpler manufacturing method would be desirable.

Recently, attempts have been made to improve and streamline the underfill process. One method that has shown some commercial potential involves dispensing underfill before assembling the flip chip to the board. This method requires that the underfill allow solder joint formation to occur. Soldering of flip chips to printed circuit boards is generally accomplished by applying flux to the bumps on the flip chip or to the circuit pads on the printed circuit board. Thus, it has been suggested to use an underfill that is dispensed first, prior to making solder connections. In order to facilitate solder bonding, however, the underfill must contain flux or have inherent properties that facilitate solder joint formation. Flux is used since the pads on printed circuit boards often oxidize, and since solder bumps on flip chips are always oxidized. Thus, the flux is designed to remove the oxide layers facilitating solder joint formation.

Certain underfills commonly called "dispense first underfills" have been designed with self-contained flux chemistry. Unfortunately, the properties required for a good flux and those required for a good underfill are not totally compatible. As such, a compromise of properties results. The best flux/underfill materials typically require more than an hour to harden. Additionally, flux-containing underfills still require the use of special equipment including robot dispensing machines. Also, since solder assembly and underfill application are combined into a single step, the flip chip cannot be tested until the assembly is complete. Thus, if the chip does not operate satisfactorily, it cannot be removed because the underfill will have hardened, thereby preventing reworking.

Finally, certain problems have been found to arise when applying flux/underfill materials to bumped surfaces of flip chips. The problems result because the topography of the bumped surface is not readily amenable to the application of fluids, particularly those having high viscosity. Thus, providing the flux/underfill directly onto a bumped surface raises at least the possibility of discontinuities and air bubbles forming during the flux/underfill application process. Furthermore, by eliminating bumping prior to application of the flux/underfill layer, it may be possible to eliminate process steps, thereby streamlining the manufacturing process while providing chip makers with greater design and manufacturing flexibility.

Several of the issues described above have been addressed by the co-pending application referenced above. Broadly stated, that application describes a flip chip assembly which includes a substrate having a plurality of solderable contact sites on one surface and a plurality of bumps positioned on that surface such that each of the solderable contact sites has one bump associated with and affixed to each solderable contact site. Each site further includes a flux material which covers at least a portion of each bump and an underfill material which occupies the space defined between each of the bumps. The underfill material is of a depth such that at least a flux covered portion of each bump extends above the underfill. The underfill material is applied to the wafer prior to applying the bumps. The underfill material is then processed to create openings which allow it to act as a mask to assist in placement of the bumps onto the surface of the integrated circuit.

Despite the advances of the above, a need still exists for a process that provides the advantages of an integrated mask and underfill with a simple processing method for forming two-stage solder bumps.

SUMMARY OF THE INVENTION

The present invention relates to a method for producing a flip chip having bumps, underfill material and flux, wherein the bumps are two-stage bumps. In practice, the present invention broadly relates to a method in which a wafer or chip having connecting pads on its surface is provided with a layer of mask/underfill material. The material is processed to form vias, i.e. apertures, which expose each of the underlying pads on the wafer or chip surface. In so doing, a mask is created in the underfill material. A high melting metal is provided in each of the apertures to form columns which contact the pads and extend upward therefrom. The columns are preferably formed of a high melting metal such as Ni, Pb, or a high Pb containing PbSn alloy. One such alloy is a lead alloy such as 3Sn/97Pb. Each of the columns is then provided with a cap formed of a solder preferably having a lower melting point, such as a eutectic solder to form a two-stage ump comprising a column of a first composition and a cap of a second composition, the econd composition having a lower melting point than the first composition. A layer of flux can then be provided over the solder caps and exposed underfill material.

If carried out on the surface of a wafer, the wafer may be singulated into integrated circuit chips at any stage in the process in which such singulation is typically performed. Alternatively, the process may be used on one or more individual chips which have been singulated prior to application of the underfill material. Once provided with the caps and flux layer, the individual chips can be packaged for shipping and/or storage.

In use, the chips are removed from their packaging and placed in contact with a printed circuit board in a manner that allows each two-stage bump to contact its corresponding contact pad on the circuit board. The chip is then mounted to the board using any of the reflow techniques that are known to those skilled in the art.

DETAILED DESCRIPTION

Figure 1:
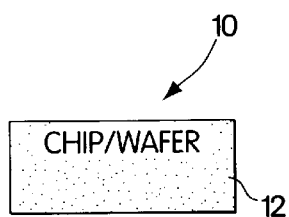
FIG. 1 is a schematic representation of a substrate comprising an integrated circuit chip, or a portion of a wafer containing several integrated circuit chips.

It is an object of the present invention to produce a stratified "two-stage" bump while simultaneously providing flux and underfill as part of the flip chip using a simple and inexpensive process. The process of the invention is used to create a bumping mask that also serves as the underfill later in the assembly stage. As will be described in detail below, the masking and bumping processes allow a two-stage bump, i.e., a stratified bump, to be easily produced at low cost.

By forming a two-stage bump, several advantages can be realized, these include the ability to control bump height since the column portion of the bump can be a non-melting or a high temperature metal or alloy, the ability to conduct low-cost plating without the need to remove the mask, and the ability to produce a "tall" bump by electroless plating. This can be achieved because the mask will only allow vertical plating. Normally, electroless plating can only produce a shallow bump because plating without a mask is isotropic and the bump will widen and eventually cause an electrical short circuit against a neighboring bump. In addition, the inventive process allows the use of a fatigue-resistant alloy for the column portion of the bump, as well as the use of a low alpha-particle emission metal such as nickel, thereby allowing the lower stage of the bump (i.e. the column) material to reduce soft errors in the integrated circuit.

Electroless plating has not been effective for this purpose since insufficient height resulted without a mask. While a temporary mask could be used to achieve the same effect, the requirement that such a mask be placed and then removed adds substantial complexity and cost to the manufacturing process. In the present invention, mask removal does not occur because the mask is later used as the underfill material.

The material selected for use as the mask also has properties suitable for use as a flip chip underfill, or at the very least, can develop such properties during reflow solder assembly processing. The preferred material is a thermoplastic, such as Staystik™, commercially available from Alpha Metals, Inc. This material is then modified with a predetermined amount of an appropriate filler to provide the underfill with a coefficient of thermal expansion (CTE) that approximates that of the joints which will be formed by the bumps. A mineral filler such as silicon dioxide is preferred. The preferred CTE of the resulting underfill material is approximately 25 ppm/° C., although values of up to about 45 ppm/° C. are also envisioned. Even after processing the CTE of the underfill cannot become greater than about 60 ppm/° C., because this can cause detrimental thermomechanical stresses at the solder joints.

The preferred filler material is spherical and has a diameter less than the high of the bumps that will be applied to the wafer. Thus, as typical filler ranges in size from about 3 microns to about 15 microns. While silicon dioxide is preferred because of its ready availability, other non-electrically conductive materials such as aluminum nitride, aluminum oxide and beryllium oxide can be used as well.

A solvent, or solvent blend, which is compatible with each of the components is selected. Among the suitable solvents are included many common oxygenated, nitrogen-containing solvents as well as many polar aromatic solvents. The particular solvent system chosen should have evaporation and boiling points that allow removal of the solvent in the environment of a drying oven once the wafer is coated with the underfill material. Suitable solvents can be found in the Staystik pastes available from Alpha Metals, Inc.

Figure 2:
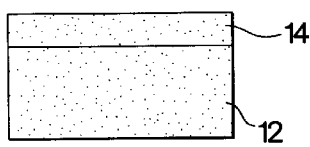
FIG. 2 is a schematic representation of the substrate of FIG. 1 following application of a mask/underfill material layer.

FIG. 1 provides schematic representation of a wafer assembly 10 used in the present invention. In FIG. 1, the assembly 10 simply comprises a wafer 12 that has been processed to a point at which it is desirable to apply bumps. In use, as shown in FIG. 2, an underfill material 14 is applied directly to the face, or active, side of the wafer 12 prior to bumping. Semiconductor wafers typically have access, or bonding, pads (not shown) formed of aluminum or copper. Such pads are typically made solderable prior to bumping and, in this case, prior to applying the underfill material 14. The access pads are rendered solderable by depositing a solderable finish, often referred to as under-bump metallization (UBM). Several UBM processes are commercially available, as are third-party UBM services provided by vendors. In the UBM process, the solderable finish is usually applied to the aluminum access pads using either vacuum deposition or chemical plating.

The underfill material 14 is applied as a fluid solution, and can be formulated to have the correct rheology for application to the wafer 12 using any of a number of methods. For example, since the ratio of solvent to solids in the solution determines the viscosity of the solution, it is possible to formulate underfill solutions that can be applied using different methods. Since the solvent is substantially entirely evaporated after application of the underfill solution to the wafer 12, the resulting, solid underfill layer 14 can have a predetermined composition regardless of the initial viscosity and percent solids of the underfill solution. This results because the solvent acts simply as a vehicle for carrying the solids during underfill application.

In one method, the underfill solution can be applied by spin coating, a common semiconductor processing method in which liquid is deposited onto a spinning wafer in order to provide a smooth and level coating. An underfill having a viscosity in the range of about 80–85 Kcps, measured at 2.5 RPM using an RVT #6 spindle on a Brookfield viscometer, has been found to give good results. When applied to a wafer, a wafer spin rate of about 1200 RPM yields a smooth coating.

A second method is stencil printing. This method requires a more viscous material that is produced using less solvent. The thixotropic index, (i.e., change in viscosity as a result of mechanical shearing), can also be adjusted, using thixotropic additives, to improve printing characteristics. The thickness of the stencil determines the amount of material applied to the wafer. Likewise, the amount of solvent contained in the underfill solution determines the amount of thickness reduction that occurs in the underfill during drying and solvent evacuation. Thus, it is necessary to consider both the stencil thickness and the solvent percent of the underfill solution in order to precisely control the thickness of the applied underfill. A dry underfill thickness range of about 25 to about 125 microns is suitable and will depend on the height of the bumps to be produced at a later stage. The thickness of the underfill layer is selected to preferably be from about 50 to about 80% of the bump height to allow form the bumps to collapse during the reflow step.

It should be understood that while spin coating and stencil printing are preferred, many other methods can be used to apply the underfill to the layer. These include, but are not limited to, needle deposition, spraying, screen printing and others.

The coating is then dried by heating it in an oven or by direct heating of the wafer. It has been found to be advantageous to heat the wafer using a forced hot air oven to help drive solvent out of the coating. Combined top and bottom heating can eliminate any tendency to trap solvent in the underfill layer by a process known as "skinning" in which the surface of the underfill material dries prematurely and forms a film (i.e., a skin) that acts as a barrier to further solvent evacuation. If drying is carried out properly, the resulting underfill material is non-tacky and amenable to handling.

Alternatively, the coating composition can be cast onto a release paper and then dried into a film. The film can be cut into a proper shape, called a preform, and applied to the wafer. Heating, with the application of pressure, will cause the underfill layer to bond to the wafer.

Figure 3:
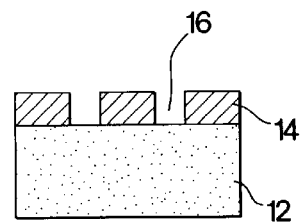
FIG. 3 is a schematic representation of the coated substrate of FIG. 2 following processing to create apertures in the underfill material, thereby allowing that material to act as a mask.

As may be seen in FIG. 3, in order to apply bumps to the underfill-coated wafer 12, apertures 16 must be formed in the underfill material 14 at the site of each interconnect pad location. In one preferred embodiment, the openings are formed using laser machining techniques. Excimer lasers, for example, can be used to create openings in polymeric films by a photoablation process in which ultra-violet radiation causes the long-chain polymers to break down into small volatile by-products. Patterning can be achieved using either a pattern mask or a directed beam. Optical defraction grating patterning methods are also available. Photoablation is particularly suitable for the present application because it occurs with only a minimum amount of heating and does not damage the wafers. The process parameters can be set so that machining stops when the metal layer below the underfill is exposed, thereby making the process self-limiting. This is not always necessary, however, since many metals are resistant to laser ablation. Although UV lasers are preferred, other lasers, such as infrared (IR) lasers can be used as well.

Figure 4:
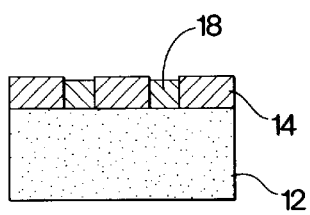
FIG. 4 is a schematic representation of the masked substrate of FIG. 3 following formation of columns defined by the mask.

As shown in FIG. 4, the column portion of bumps 18 of a suitable metal or alloy are next applied to the wafer 12 using the underfill 14 as a mask which exposes only those section of the wafer 12 which are to have bumps 18 applied, i.e., the pad areas of the wafer which are exposed by the apertures 16. Any bumping methods that do not require mask removal may be employed. In one embodiment, electroless plating can be used. Although the method does not typically require a mask, a high aspect ratio of plated material can be provided using the mask, and in the case of bumps, such high aspect ratios are desirable. In cases in which a zincate-electroless nickel process is employed, under bump metallization (described above) can be eliminated since the zincate treatment makes the aluminum platable by nickel.

Bumps 18 made only from solder may be made by starting with solder pastes that are widely available. Stenciling, screen printing, pin transfer and other methods can also apply solder paste. Once the paste has been applied, the bump is formed by melting (i.e., reflowing) the paste. It is necessary to control the conditions at this point, however, because the underfill can soften or even liquefy into a viscous state if it is heated too much during the solder reflow process. Other methods for forming the column portions of bumps include metal fluid jetting, or inverting the wafer and passing it over a solder wave or fountain of molten solder.

Figure 5:
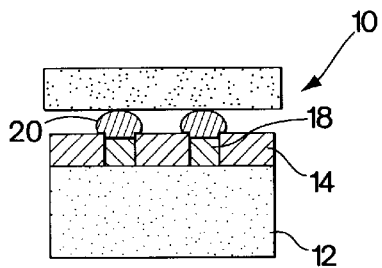
FIG. 5 is a schematic representation of the assembly of FIG. 4 following formation of solder caps on each of the columns.

In FIG. 5, the assembly 10 has had caps 20 applied to the bumps 18. As noted above, these caps are typically formed of a composition having a lower melting point than the composition forming the columns. As a result, the caps 20 are designed to reflow and affix the columns securely to a circuit board during reflow soldering without reducing the security of the bond between the bumps 18 and the wafer substrate 12. The caps can be formed from the application of a solder paste which can be screen-printed or stenciled over the columns and then reflowed. Solder will not wet the underfill layer, as such, a well-formed and perfectly aligned cap 20 will form over each column.

Figure 6:
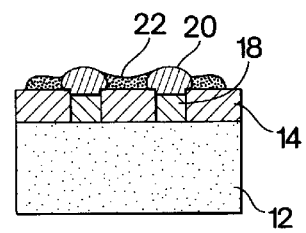
FIG. 6 is a schematic presentation of the assembly of FIG. 5 following application of a flux material to the solder caps and exposed underfill material.

In FIG. 6, flux 22 has been deposited onto the protruding solder caps 20 and onto the exposed portion of the underfill material 14 which surrounds each bump 18. Any of a variety of flux coating methods well-known in the art may be employed. Of course, if desired, since the flux is not needed on the underfill material 14, the flux 22 may be deposited only on the solder caps 20, and not on the surrounding underfill 14. Since the solder caps protrude above the surface of the underfill material, a number of methods to achieve this can be used. For example, a thin layer of liquid flux can be coated onto a flat plate of glass. The wafer assembly can then be placed, capped bumps down, onto the thin film of flux and then withdrawn. A thin coating of flux, which can be subsequently dried, will remain on the bumps. Other methods such as roller coating, screen printing and tamp printing can be used as well.

If not previously performed, the wafer can now be diced, or singulated, to produce individual flip chips. Any of a wide variety of the methods known in the art for dicing wafers can be employed to that end. The sole requirement of the inventive wafers is that the process be such that it does not interfere with the underfill material, solder portions or flux applied to the wafer/chip surfaces.

Figure 7:
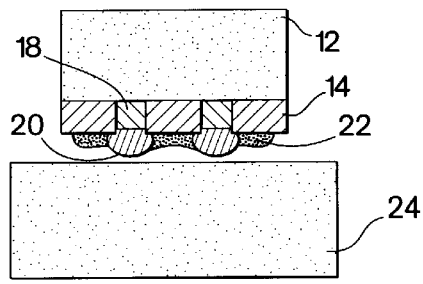
FIG. 7 is a schematic representation of the assembly of FIG. 6 placed in contact with a printed circuit board.

Once diced, individual flip chips may now be bonded to circuit boards and the like. As shown in FIG. 7, a flip chip assembly 10 can be placed and aligned to the bond pads (not shown) of a substrate 24. As used herein, the term "substrate" is intended to mean a circuit board, a chip carrier, another semiconductor device or a metal lead frame. It is not necessary to use additional flux, although flux may be added for special reasons such as compensating for excessive oxide on substrate pads, or the need to hold the flip chip in place during assembly.

The positioned chip is then run through a solder reflow line commonly used for assembly. A multi-zone oven, with individual heat controls that permit a heating profile is preferred. The flux melts at a temperature ranging from about 80° C. to about 140° C. The melting point is determined by selecting fluxes having epoxy resins with the appropriate melting point. Flux composition will be described in greater detail below. At higher temperatures, the underfill softens and may also melt depending upon the resin selected. Like the fluxes, underfill composition will be described in greater detail below. The solder bumps finally melt and form metallurgical joints to the substrate.

Alternatively, a standard flip chip bonder that can apply heat and pressure can be employed instead of the reflow oven. In that embodiment, the flip chip coated with the flux and underfill is placed into contact with the conductive pads on the circuit board and heat from the bonder head will activate the flux, form joints by reflowing the bumps, and cause the underfill and flux system to bond tightly to the board. The use of a standard flip chip bonder would allow a flip chip to be assembled to a board that already contained mounted components. This method could also be used to assemble a chip at a site that is being reworked.

Reworking is desirable in situations in which a chip mounting step has failed to properly position the chip on the board. Specifically, the assembly of fine pitch, high-density components can result in misalignments and failed connections. Furthermore, since it is difficult to fully test an unpackaged device such as a flip chip, it becomes desirable to be able to remove the chip if final testing indicates that the chip is not operating optimally, either through a fault with the chip or as a result of improper mounting. Thermoset underfills do not allow the assembly to be reworked since thermosets cannot be melted once they have crosslinked.

The present invention eliminates the problems associated with thermoset underfills by incorporating a thermoplastic resin as the main component of the underfill. Thus, the chip can be removed by raising the chip temperature to above the melting point of the solder (approximately 183° C. for tin/lead solder) and above the de-bonding temperature of the underfill resin. Typically, the rework temperature must be above the solder reflow temperature, but less than about 220° C. depending on the circuit substrate. An average rework temperature would be about 200° C. The temperature can be higher if localized heat is used; for example, in an alternate embodiment, a chip bonder could be used to remove chips from a substrate post-bonding. In still another embodiment, the underfill may also include a B-staged thermoset that will de-polymerize at an elevated temperature.

Figure 8:
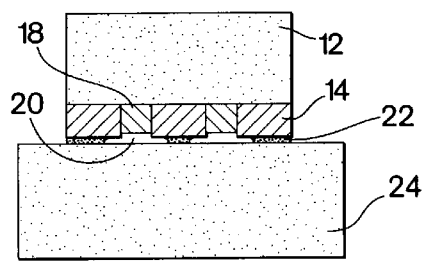
FIG. 8 is a schematic representation of the assembly of FIG. 7 following a reflow process.

Once mounted, the flip chip is as shown in FIG. 8. Specifically, the assembly 10 includes solder bumps or columns 18 and flattened caps 20 affixed to a substrate 24. In the regions between the individual solder columns 18 and between the chip 12 and the substrate 24, the underfill material 14 fills gaps, provides mechanical resistance to thermomechanical stresses and provides a substantially uniform coefficient of thermal expansion across the broad plane of material in contact with the substrate 24 surface.

Suitable thermoplastic resins include phenoxy, acrylic, methacrylic, polycarbonate, polyamides, polybutene, polyesters and some polyolefins. It is noted that the underfill does not need to be melted, rather, it is only necessary for the underfill to soften for de-bonding. Desirable polymers for use as thermoplastic underfill material include thermoplastic die attach adhesives available from Alpha Metals under the trade name Staystik. Such materials can be de-bonded cleanly at elevated temperatures. Thus, when such materials are used, the thermoplastic film can be pealed away from both the chip and the circuit at elevated temperatures, leaving no residue.

Alternatively, the underfill can be made from a resin that is known to debond when a specific solvent is applied. One such resin system is a temporary attach adhesive available from Alpha Metals under the trade name Staystik 393. Underfills made with Staystik can be modified to contain a low expansion inorganic filler, preferably, a spherically-shaped silica of about 5 to about 15 microns in diameter. In order to achieve the desired coefficient of thermal expansion (CTE) close to that of tin/lead solder (22.5 ppm/deg.° C.), the underfill should comprise about 60–70% by weight silica and about 20–30% resin. Note that one advantage of using Staystik 393 is that it does not dissolve, but does debond in the presence of alcohol, thereby providing a system by which any residue can be easily removed.

An underfill made with resins of the type described above would allow the underfill to debond by adding alcohol around the chip site. That not withstanding, however, the joints would still have to be heated to reflow temperatures to allow the chip to be removed.

The present invention recognizes that flux is required only at the areas of the bumps, and not in the spaces in between those connecting elements. Thus, the present invention separates the flux from the underfill in the regions between the bumps. Furthermore, by maintaining the flux and underfill as separate entities, additives tailored to each individual component may be added to provide both the flux and the underfill with desired properties. For example, the underfill can be a thermoplastic that de-bonds at elevated temperatures, or the flux layer can be designed to de-bond. As an alternative, the flux can convert to a strongly-bonded polymer after its mission as a flux has been accomplished, and the underfill can have the de-bonding properties. As such, a system in which the flux and underfill are maintained as separate entities is extremely versatile.

In one embodiment, the underfill material is preferably a thermoplastic or a thermoset having a very low crosslink density. In either case, the underfill material is filled with a low expansion inorganic particulate material such as silica. The resulting underfill should preferably have a coefficient of thermal expansion (CTE) that approximates that of the solder joint or other joining material. In the case of eutectic solder joints, the CTE should range from approximately twenty to thirty parts per million per ° C. It is preferred that the resin system is soluble in a safe solvent system to allow the resin to be coated as a liquid in a viscosity range suitable for wafer-coating methods. Although a dry polymer film or powder could be coated onto the wafer by melting, a liquid is preferred because of the availability of wafer dispensing and coating equipment adapted to liquid handling processes. Additionally, this embodiment includes a layer of flux that is designed to be compatible with flip-chip assembly and underfills.

One such flux system includes epoxy resins and an organic carboxylic acid or anhydride, or a combination thereof. In the present invention, a flux can be made by dissolving an organic acid an a solid epoxy resin or a mixture of solid and liquid epoxy resin in a polar solvent. The flux can then be coated in the liquid state and dried to a solid film at room temperature. Although the preferred flux application methods are spin coating, spraying, or stenciling, the wafer can also be coated using a dipping process in which the bump side of the wafer is pressed against a thin layer of flux on a dispensing drum consisting of a rotating platen disk and a doctor blade to control the liquid thickness.

Equivalents

From the foregoing detailed description of the specific embodiments of the invention, it should be apparent that a unique flip chip having an underfill which also acts as a mask for a two-stage bump application process has been described. Although particular embodiments have been disclosed herein in detail, this has been done by way of example for purposes of illustration only, and is not intended to be limiting with respect to the scope of the appended claims which follow. In particular, it is contemplated by the inventor that various substitutions, alterations, and modifications may be made to the invention without departing from the spirit and scope of the invention as defined by the claims.

What is claimed is:

1. A method for providing a two-stage solder bump on a wafer surface, the method comprising the steps of:

a) providing a substrate having at least one solderable contact site on a surface thereof;

b) applying an underfill material to the substrate surface in a manner which substantially entirely covers the substrate surface and the solderable contact site;

c) treating the underfill material to form at least one aperture therein, the at least one aperture extending substantially entirely through the underfill material and being located such that it exposes only the solderable contact site;

d) applying at least one bump of a first composition to the assembly in a manner such that a bump occupies each aperture in the underfill, contacts the exposed solderable contact site therein, and extends above the underfill material;

e) applying a cap to at least one bump, the cap being formed of a second composition; and f) applying a flux to the surface, the flux covering at least the exposed portions of the caps.

2. The method of claim 1 wherein the substrate comprises a semiconductor wafer.

3. The method of claim 1 wherein the substrate comprises a semiconductor chip.

4. The method of claim 1 wherein the substrate comprises a flip chip.

5. The method of claim 1 wherein the flux covers substantially the entire surface upon which the bumps are exposed.

6. The method of claim 1 wherein the flux comprises an epoxy resin and a material selected from the group consisting of carboxylic acids, anhydrides and combinations thereof.

7. The method of claim 1 wherein the underfill material comprises a thermoplastic material.

8. The method of claim 7 wherein the thermoplastic material is selected from the group consisting of phenoxy resins, acrylic resins, methacrylic resins, polycarbonate resins, polyamide resins, polybutene resins, polyester resins, polyolefin resins and mixtures thereof.

9. The method of claim 1 wherein the apertures are formed using photoablation.

10. The method of claim 9 wherein the apertures are formed using a laser.

11. The method of claim 10 wherein the laser is selected from the group consisting of excimer lasers, UV lasers and infrared lasers.

12. The method of claim 10 wherein the apertures are formed using a directed laser beam.

13. The method of claim 10 wherein the apertures are formed using a pattern mask.

14. The method of claim 1 wherein the first composition comprises nickel, lead or a high lead alloy.

15. The method of claim 14 wherein the first composition comprises 3Sn/97Pb.

16. The method of claim 1 wherein the second composition comprises a eutectic solder.

17. A method for providing a two-stage bump on a wafer surface, the method comprising the steps of:
   a) providing a substrate having at least one solderable contact site on a surface thereof, the substrate further having a layer of an underfill material applied thereto, the underfill material provided with at least one aperture, each such aperture corresponding to a solderable contact site and having a bump of a first composition contained therein;
   b) applying a cap to at least one bump, the cap being formed of a second composition; and
   c) applying a flux to the surface, the flux covering at least the exposed portions of the caps.

18. The method of claim 17 wherein the flux comprises an epoxy resin and a material selected from the group consisting of carboxylic acids, anhydrides and combinations thereof.

19. The method of claim 17 wherein the underfill material comprises a thermoplastic material.

20. The method of claim 19 wherein the thermoplastic material is selected from the group consisting of phenoxy resins, acrylic resins, methacrylic resins, polycarbonate resins, polyamide resins, polybutene resins, polyester resins, polyolefin resins and mixtures thereof.

21. The method of claim 17 wherein the first composition comprises nickel, lead or a high lead alloy.

22. The method of claim 21 wherein the first composition comprises 3Sn/97Pb.

23. The method of claim 17 wherein the second composition comprises a eutectic solder.

* * * * *